(12) United States Patent
Miller et al.

(10) Patent No.: US 7,502,401 B2
(45) Date of Patent: Mar. 10, 2009

(54) VCSEL SYSTEM WITH TRANSVERSE P/N JUNCTION

(75) Inventors: Jeffrey N. Miller, Los Altos Hills, CA (US); Scott W. Corzine, Sunnyvale, CA (US); David P. Bour, Cupertino, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 203 days.

(21) Appl. No.: 11/187,477

(22) Filed: Jul. 22, 2005

(65) Prior Publication Data

US 2007/0019697 A1    Jan. 25, 2007

(51) Int. Cl.
*H01S 5/00*    (2006.01)
(52) U.S. Cl. ............... 372/50.124; 372/46.011; 372/50.1; 372/45.01
(58) Field of Classification Search ........... 372/56.124
See application file for complete search history.

(56) References Cited

U.S. PATENT DOCUMENTS

| | | | |
|---|---|---|---|
| 4,881,236 A | 11/1989 | Brueck et al. | |
| 5,212,701 A * | 5/1993 | Choquette et al. | 372/45.01 |
| 5,422,898 A | 6/1995 | Kash et al. | |
| 5,986,996 A | 11/1999 | Kitamura et al. | |
| 6,771,680 B2 | 8/2004 | Bour et al. | |
| 6,822,992 B2 | 11/2004 | Henrichs | |
| 2002/0024987 A1* | 2/2002 | Caprara et al. | 372/92 |
| 2004/0076209 A1 | 4/2004 | Bour et al. | |
| 2004/0179566 A1* | 9/2004 | El-Bahar | 372/45 |

FOREIGN PATENT DOCUMENTS

| | | |
|---|---|---|
| EP | 62137882 | 6/1987 |
| EP | 06283812 | 10/1994 |
| EP | 08204283 | 8/1996 |
| EP | 2003324234 | 11/2003 |

OTHER PUBLICATIONS

P. Vaccaro et al. "Lateral-junction vertical-cavity surface-emitting laser grown by molecular-beam epitaxy on a GaAs (311) A-oriented substrate," J. Appl. Phys., vol. 74, No. 25, pp. 3854-3856, Jun. 1999.*
Dong-Ho Kim et al., "GaN nano epitaxial lateral overgrowth on holographically patterned," Compound Semiconductors, 2003. International Symposium on Aug. 25-27, 2003 pp. 27-38.*

* cited by examiner

*Primary Examiner*—Minsun Harvey
*Assistant Examiner*—Xnning Niu

(57) ABSTRACT

The present invention provides a VCSEL system comprising forming a first mirror, forming a vertical cavity on the first mirror, the vertical cavity including integrated multiple gain regions and forming a transverse p/n junction laterally to the integrated multiple gain regions, wherein forward biasing the transverse p/n junction causes photon emission in the integrated multiple gain regions.

10 Claims, 4 Drawing Sheets

VCSEL SYSTEM WITH TRANSVERSE P/N JUNCTION

BACKGROUND

The present invention relates generally to multiple gain region systems, and more specifically to VCSEL systems with transverse P/N junction.

Vertical cavity surface emitting lasers (VCSELs) are revolutionizing the field of telecommunications. They generally consist of a pair of semiconductor mirrors defining a resonant cavity containing a gain medium of semiconductor materials for amplifying light.

VCSELs are generally characterized by a pair of mirrors, generally referred to as distributed Bragg reflectors (DBRs), between which an optical cavity is located. The entire structure can be formed over a substrate wafer by a process called organometallic vapor phase epitaxy (OMVPE), sometimes referred to as metal organic chemical vapor deposition (MOCVD). The optical cavity generally also includes spacer layers and an active region. The active region typically includes one or more quantum wells. The quantum wells, which typically include a quantum well layer sandwiched by a pair of adjacent barrier layers, are the layers into which carriers, i.e., electrons and holes, are injected. The electrons and holes recombine in the quantum well and emit light at a wavelength determined by the material layers in the quantum well. The quantum well layer typically comprises a low bandgap semiconductor material, while the barrier layers typically have a bandgap higher than the bandgap of the quantum well layers. In this manner, when the device is subject to forward bias, electrons and holes are injected into and trapped in the quantum well layer and recombine to emit coherent light at a particular wavelength.

Electrically-pumped VCSELs include a P-I-N junction structure in which the intrinsic material that forms a quantum well is sandwiched between layers of p-type and n-type material. For optimal light emission, the quantum well should be located at a peak of the standing wave (the axial or longitudinal mode) generated in the optical cavity. However, in a VCSEL having multiple quantum well active regions, each set of the quantum wells is separated by fifty to several hundred nanometers.

The number of quantum wells in a VCSEL determines the optical gain of the VCSEL. Before coherent light is emitted from a VCSEL, many losses inherent in the VCSEL must be overcome to reach lasing threshold. Losses in a VCSEL are created by the mirrors, diffraction, and distributed losses. Losses in the mirrors are due to the mirror reflectivity being less than 100%. Indeed, if the mirrors were 100% reflective, light could not be emitted from the VCSEL. Diffraction losses are caused when the emitted light expands as it propagates away from a guiding aperture in the VCSEL. Distributed losses are caused by scattering and by absorption of light in the VCSEL structure. The QW gain must be sufficient to overcome these combined losses. Therefore multiple QW active regions are advantageous, especially for high temperature operation and for enabling modulation at high data rates.

If more QWs are required than can fit under one maximum of the standing wave that exists in the cavity, additional QW active regions may be included in a resonant periodic gain (RPG) arrangement. An RPG VCSEL structure includes two or more active regions, with each active region lying under separate maxima in the standing wave (thus separated by some multiple of ½ wavelength). This RPG structure is used to maximize the optical gain of VCSELs.

While RPG VCSELs have been demonstrated in the more common GaAs- and InP-based materials used for red and near-infrared emitters, GaN-based VCSELs are far more challenging. This is due to their relatively poor optoelectronic characteristics, including less efficient carrier transport, defective structure, etc., which translate into low gain and high loss. Thus, for GaN-based ultraviolet or visible VCSELs exhibiting high efficiency and low threshold current and voltage, an active region incorporating several sets of QWs in an RPG arrangement is especially beneficial for achieving the requisite optical gain.

However, uniform electrical pumping of multiple GaN-based active regions has not been demonstrated. Moreover, pumping multiple GaN-based active regions with a single p-n junction is very challenging, due in part to the poor hole-transport in GaN.

DISCLOSURE OF THE INVENTION

The present invention provides a VCSEL system comprising forming a first mirror, forming a vertical cavity on the first mirror, the vertical cavity including integrated multiple gain regions and forming a transverse p/n junction laterally to the integrated multiple gain regions, wherein forward biasing the transverse p/n junction causes photon emission in the integrated multiple gain regions.

Certain embodiments of the invention have other advantages in addition to or in place of those mentioned or obvious from the above. The advantages will become apparent to those skilled in the art from a reading of the following detailed description when taken with reference to the accompanying drawings.

BEST MODE FOR CARRYING OUT THE INVENTION

Figure 1:
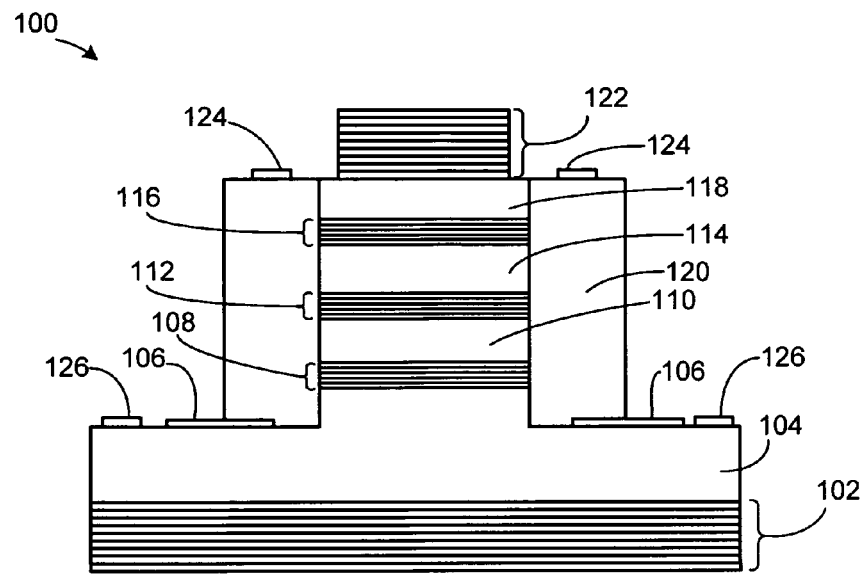
FIG. 1 is a cross-sectional view of a VCSEL system in an embodiment of the present invention.

In the following description, numerous specific details are given to provide a thorough understanding of the invention. However, it will be apparent that the invention may be practiced without these specific details. In order to avoid obscuring the present invention, some well-known structures, configurations, and process steps are not disclosed in detail.

Likewise, the drawings showing embodiments of the apparatus/device are semi-diagrammatic and not to scale and, particularly, some of the dimensions are for the clarity of presentation and are shown greatly exaggerated in the drawing FIGs. The same numbers will be used in all the drawing FIGs. to relate to the same or similar elements.

Similarly, although the sectional views in the drawings for ease of description show the invention with mounted surfaces as oriented downward, this arrangement in the FIGs. is arbitrary and is not intended to suggest that the invention should necessarily be attached in a downward direction. Generally, the invention can be operated in any orientation. The same numbers are used in all the drawing FIGs. to relate to the same elements.

The term "horizontal" as used herein is defined as a plane parallel to the conventional plane or surface of the substrate, regardless of its orientation. The term "vertical" refers to a direction perpendicular to the horizontal as just defined. Terms, such as, "above", "below", "bottom", "top", "side" (as in "sidewall"), "higher", "lower", "upper", "over", and "under", are defined with respect to the horizontal plane. The term "on" indicates that one element is in direct contact with another.

Referring now to FIG. 1, therein is shown a cross-sectional view of a VCSEL system 100 in an embodiment of the present invention. The VCSEL system 100 includes a distributed Bragg reflector including a first mirror 102, a bulk n-type semiconductor region 104, such as AlGaN, an intermediate layer 106, such as $SiO_2$, a first gain region 108, a first n-type semiconductor spacer 110, a second gain region 112, a second n-type semiconductor spacer 114, a third gain region 116, a third n-type semiconductor spacer 118, an outer shell 120, of p-GaN, a second mirror 122, a p-type contact 124 and an n-type contact 126. While this example shows three active regions, the first gain region 108, the second gain region 112 and the third gain region 116, in a resonant periodic gain configuration, different numbers of active regions could also be used, including a single active region, or two or more active regions in an RPG arrangement.

The first mirror 102 comprises multiple layers of complementary refractive dielectric materials such as $TiO_2$ and $SiO_2$. Each of the layers has an optical thickness of about ¼ of a wavelength and the layers are combined until the first mirror 102 has an overall reflectance of almost 100%. For illustrative purposes the first mirror 102 is shown having six layer pairs, but it is understood that the first mirror 102 may have any number of layer pairs. Other combinations of complementary dielectric materials are also possible. The bulk n-type semiconductor region 104 is grown epitaxially by organometallic vapor phase epitaxy (OMVPE) on a sapphire or SiC substrate to form the base of the n-type vertical cavity. The entire vertical cavity is grown of n-type semiconductor material including integrated multiple gain regions and n-type semiconductor spacers.

The first gain region 108, the second gain region 112 and the third gain region 116 are formed of InGaN and are spaced multiples of ½ wavelength (λ) between each other. The spacing allows for resonant periodic gain (RPG), which maximizes the optical gain of the VCSEL. The intermediate layer 106 forms a dielectric ELOG (Epitaxial Layer Over Growth) mask for the p-GaN of the outer shell 120. The outer shell 120, formed of p-GaN, and the InGaN quantum wells of the first gain region 108, the second gain region 112 and the third gain region 116, further include a transverse p/n junction.

The transverse p-n junction is formed by selective epitaxial deposition of the p-type GaN outer shell 120 around an etched pillar. In the first epitaxial growth the entire VCSEL cavity including spacer layers 104, 110, 114, and 118, along with the active regions 108, 112, and 116 are deposited in a planar fashion. Subsequently, a dielectric mask ($SiO_2$ or $Si_3N_4$) is deposited and patterned over the surface, and used to define and etch the VCSEL pillar. The pillar may be of circular, hexagonal, or some other shape, and of a dimension that would favor single-spatial mode operation. The etching may be performed by RIE (reactive ion etching) or CAIBE (chemically-assisted ion beam etching). The etching terminates in the lower spacer 104, and is followed by deposition and patterning of the intermediate masking layer 106 on the etched surface around the base of the pillar. With the etch mask over the top of pillar still intact, the wafer is returned to the OMVPE reactor for selective overgrowth of the p-type GaN outer shell 120. Following the selective overgrowth, the etch mask over the top of pillar is removed by etching. Then the top dielectric mirror 122 is deposited by, for example, sputtering, and defined over the top of the pillar. Finally, the metal p-electrodes 124 and n-electrodes 126 are established.

The p-type contact 124 and the n-type contact 126 are used to forward bias the transverse p/n junction. When forward biased, the quantum wells of the first gain region 108, the second gain region 112 and the third gain region 116, form a lower bandgap with the outer shell 120 than the first n-type semiconductor spacer 110, the second n-type semiconductor spacer 114 or the third n-type semiconductor spacer 118. The forward biased junction between the outer shell 120 and the InGaN quantum wells pass current at a lower threshold voltage than the junction between the outer shell 120 and the first n-type semiconductor spacer 110, the second n-type semiconductor spacer 114 or the third n-type semiconductor spacer 118.

For illustrative purposes, the first mirror 102 and the second mirror 122 are shown as being constructed of dielectric materials, configured as distributed Bragg reflector (DBR), although it is understood that other reflector materials, processes or construction may be used, as well. The spacing of the first mirror 102 and the second mirror 122 is such that they are integer multiples of ½ wavelength from each other, forming a Fabry-Perot resonant cavity.

Figure 2:
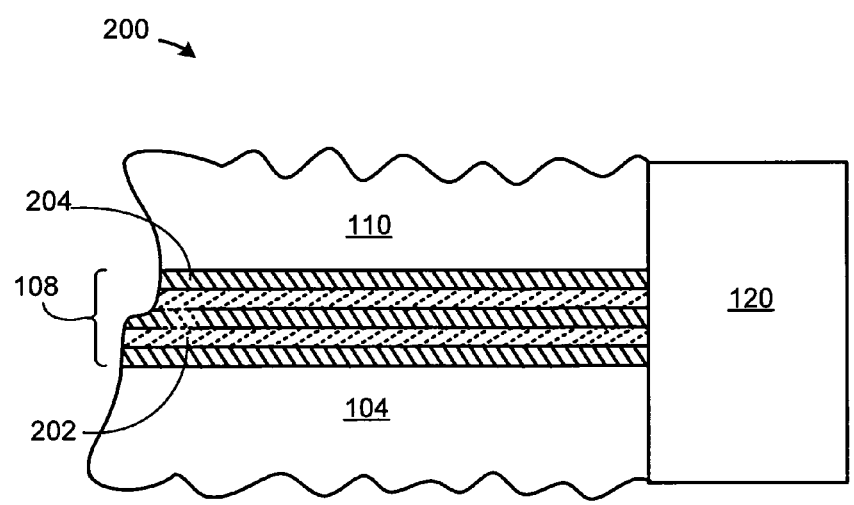
FIG. 2 is a more detailed cross-sectional view of the first gain region of the VCSEL system as shown in FIG. 1.

Referring now to FIG. 2, therein is shown a more detailed cross-sectional view 200 of the first gain region 108 of the VCSEL system 100 as shown in FIG. 1. The first gain region 108 is formed of InGaN in barrier layers 202 and quantum well layers 204. The quantum well layers 204 are of a lower bandgap material than the barrier layers 202, the first n-type semiconductor spacer 110, the second n-type semiconductor spacer 114, and the third n-type semiconductor spacer 118. When forward biased, electrons and holes are injected into the quantum well layers 204, where the ensuing radiative recombination produces photon emission. The turn-on voltage of the p-n junctions associated with the adjacent first n-type semiconductor spacer 110, the second n-type semiconductor spacer 114, and the third n-type semiconductor spacer 118 is elevated relative to the active region p-n junction by typically a few tenths of a volt. Because of this lower turn-on voltage, the active regions are efficiently injected in a parallel configuration, and injection across the spacer layers' p-n junctions is suppressed. Thus, the reduced turn-on voltage prevents the other n-type layers from conducting current.

The first gain region 108 has several of the quantum well layers 204. The bulk n-type semiconductor region 104 and the first n-type semiconductor spacer 110, form barrier layers adjacent to the quantum well layers 204 on the bottom and top of the first gain region 108. The addition of the outer shell 120 creates multiple transverse p/n junctions that form a gain region in the n-type vertical cavity. By stacking transverse p/n junctions, having lower bandgap than the n-type semiconductor spacers, an efficient VCSEL can be manufactured. Each transverse p/n junction is formed laterally to the integrated multiple gain regions to recombine electrons and holes, once the junctions are forward biased, for photon emission.

For illustrative purposes, the first gain region 108 is shown with n-type InGaN, although it is understood that other materials, processes or construction may be used, as well. It is further understood that the second gain region 112 and the third gain region 116 are constructed in the same manner as the first gain region 108.

Figure 3:
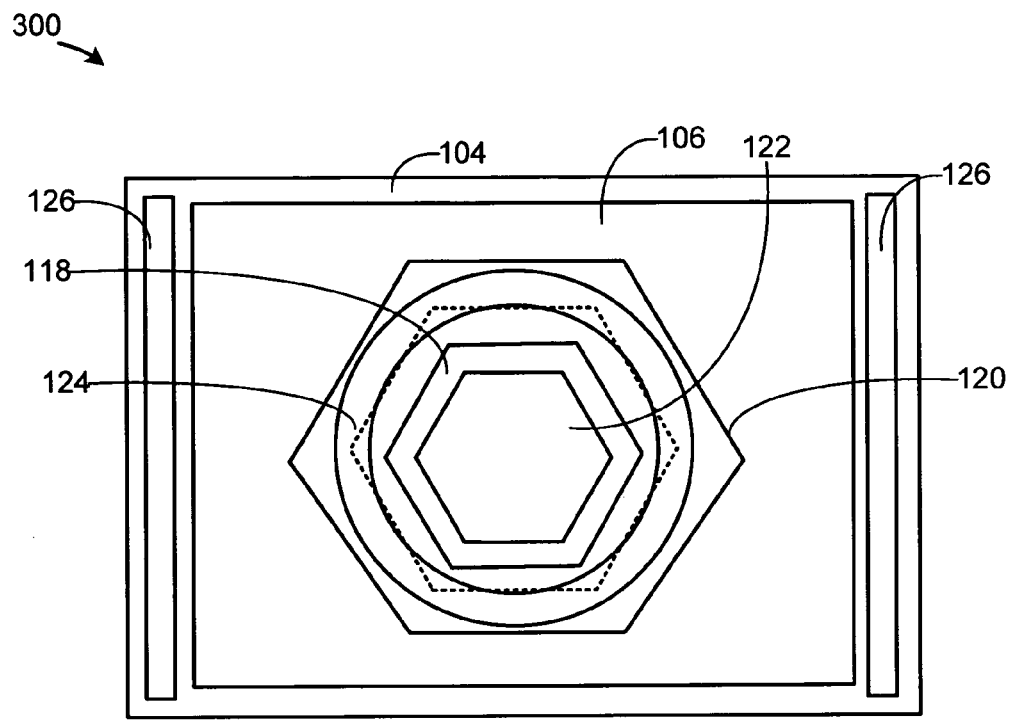
FIG. 3 is a top view of the VCSEL system as shown in FIG. 1.

Referring now to FIG. 3, therein is a top view 300 of the VCSEL system 100 as shown in FIG. 1. The top view 300 includes the bulk n-type semiconductor region 104, the intermediate layer 106, the third n-type semiconductor spacer 118, the outer shell 120, the second mirror 122, the p-type contact 124 and the n-type contact 126. The shape of the second mirror 122 is shown as a hexagon, but it is understood that it can be any geometric shape that will fit over the third n-type semiconductor spacer 118. The p-type contact 124 and the n-type contact 126 allow electrical connection to the device.

Above the lasing threshold, majority or all photon emission occurs through the second mirror 122 if the reflectivity of the second mirror 122 is less than the reflectivity of the first mirror 102. For illustrative purpose, the first mirror 102 and the second mirror 122 are shown as DBR structures of similar construction where the second mirror 122 structure possesses a lower reflectivity with fewer layer pairs than the number of layer pairs of the first mirror 102, or fabricated from a different set of dielectric or semiconducting materials.

Figure 4:
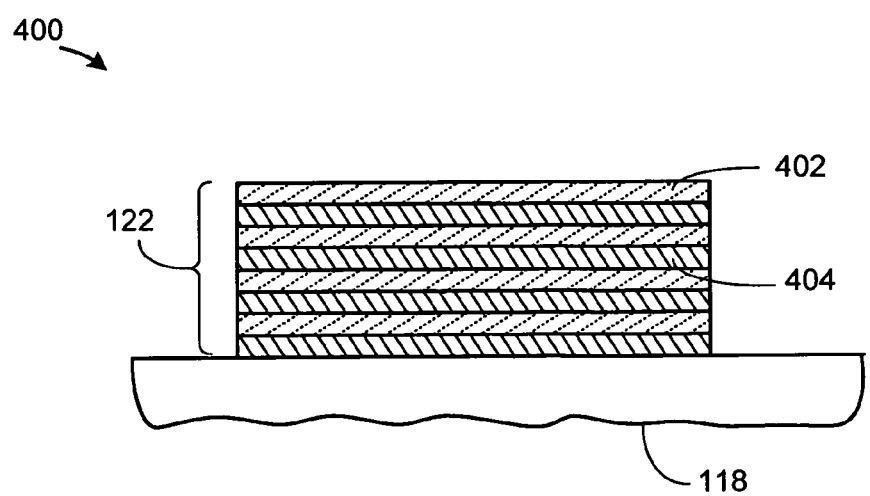
FIG. 4 is a more detailed cross-sectional view of the second DBR of the VCSEL system as shown in FIG. 1.

Referring now to FIG. 4, therein is shown a more detailed cross-sectional view 400 of the second mirror 122 of the VCSEL system 100 as shown in FIG. 1. The second mirror 122 is formed of multiple layer pairs of complementary refractive dielectric material. Such a complementary layer pair can be made from a number of different combinations of materials including semiconductor layers, dielectric materials such as $TiO_2$ (titanium dioxide) and $SiO_2$ (silicon dioxide), or hybrid combinations of semiconductor, dielectric and metal layers. Materials and construction determine the type of reflector such as a "dielectric" DBR or a semiconductor DBR or a metal DBR. The present invention discloses the dielectric DBR, but it is understood that the present invention can be implemented with semiconductor or metal DBR as well.

The second mirror 122 is formed using alternating layers of a first dielectric layer 402 and a second dielectric layer 404 which are materials that have complementary refractive indices. The second mirror 122 is formed on top of the first gain region 108, the second gain region 112 and the third gain region 116 for photon reflection. The reflectivity of the reflector is determined by the refractive index and thickness of the materials of the layers constituting the layer pairs, with the second mirror 122 being slightly less reflective than the first mirror 102.

Figure 5:
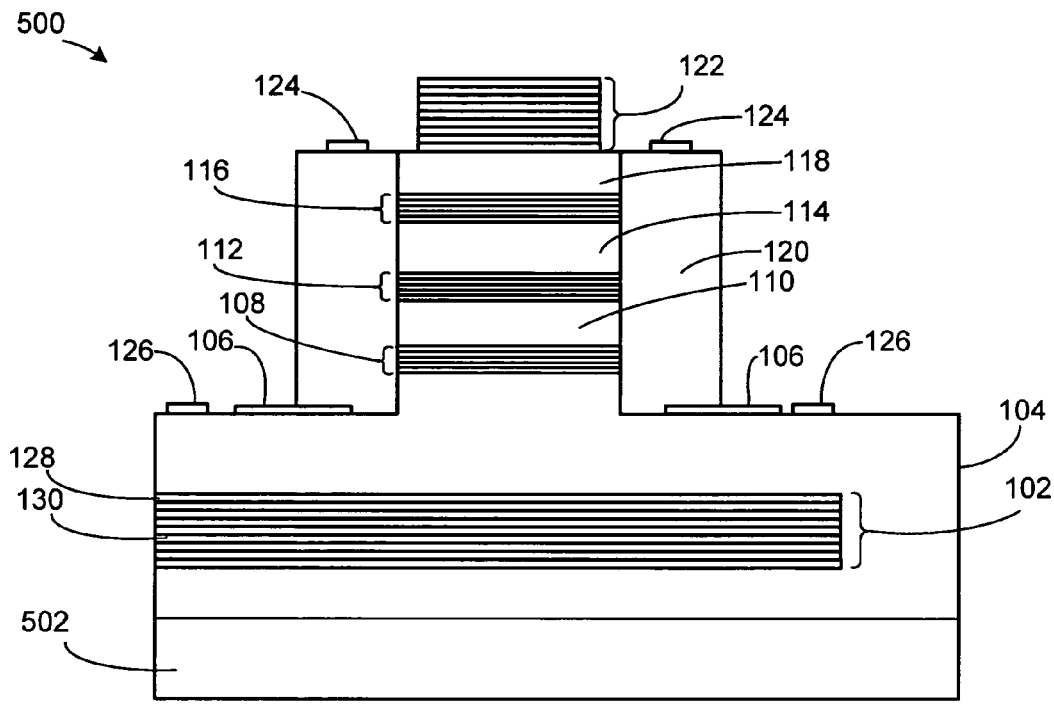
FIG. 5 is a cross-sectional view of the VCSEL system, in an alternative embodiment of the present invention.

Referring now to FIG. 5, therein is a cross-sectional view of the VCSEL system 100, in an alternative embodiment 500 of the present invention. Similar to the VCSEL structure in FIG. 1, the difference in this embodiment of the present invention utilizes a substrate 502, of a material such as sapphire, with the bulk n-type semiconductor region 104 formed around the edge of the first mirror 102. This embodiment represents another manufacturing approach for the present invention.

Figure 6:
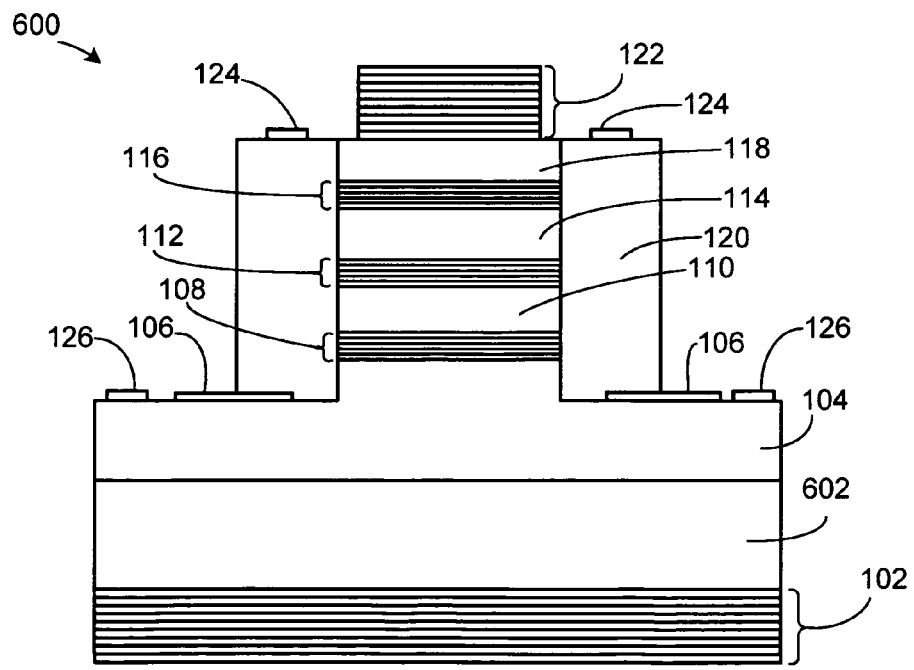
FIG. 6 is a cross-sectional view of the VCSEL system, in another alternative embodiment of the present invention.

Referring now to FIG. 6, therein is shown a cross-sectional view of the VCSEL system 100, in another alternative embodiment 600 of the present invention. Similar to the VCSEL structure in FIG. 1, the difference in this embodiment being that the bulk n-type semiconductor region 104 is grown on a substrate 602 of a material such as sapphire ($Al_2O_3$), silicon carbide (SiC) or gallium nitride (GaN). Another solution to the manufacture of the present invention is to start the device growth on the substrate 602, which is removed prior to depositing or wafer bonding the first mirror 102 onto the device. Yet another solution to the manufacture of the present invention is to start the device growth on the substrate 602 and attach the first mirror 102 to the bottom of the substrate 602 by wafer bonding or dielectric deposition techniques.

Figure 7:
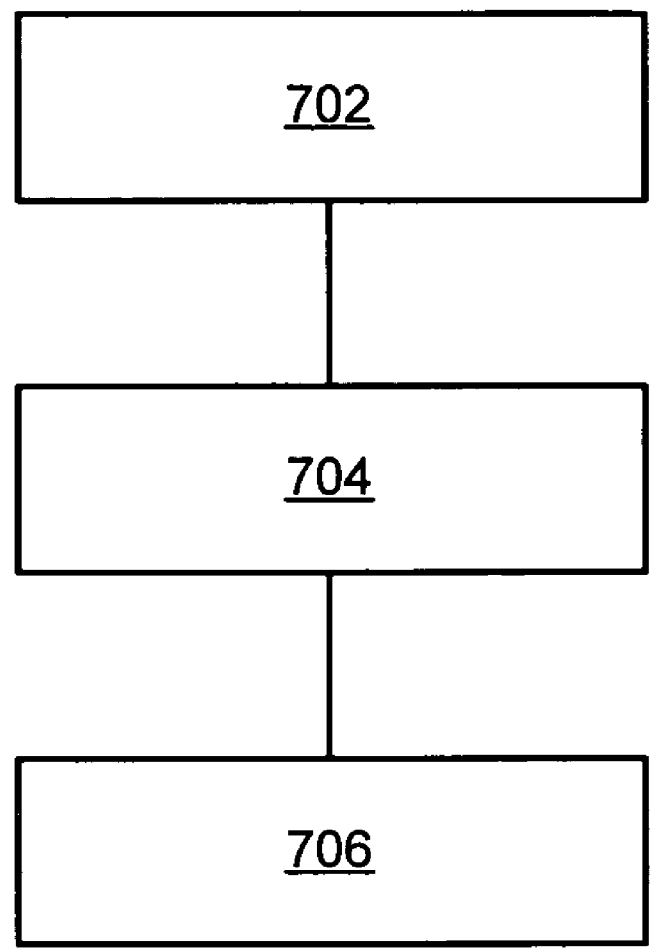
FIG. 7 is a flow chart of a system for VCSEL system in an embodiment of the present invention.

Referring now to FIG. 7, therein is shown a flow chart of a system 700 for the VCSEL system 100 with transverse p/n junction in an embodiment of the present invention. The system 700 includes forming a first mirror in a block 702; forming a vertical cavity on the first mirror, the vertical cavity including integrated multiple gain regions, in a block 704; and forming a transverse p/n junction, wherein forward biasing the transverse p/n junction causes photon emission in the integrated multiple gain regions, in a block 706.

It will be understood that the flow chart of the system 700 is merely exemplary and many other steps may be added and some removed as would be evident to those having ordinary skill in the art from a reading of the above disclosure.

In greater detail, a method to fabricate the VCSEL system 100, in an embodiment of the present invention, is performed as follows:

1. The first gain region 108, the second gain region 112 and the third gain region 116 are formed in a vertical cavity for photon emission. (FIG. 1)
2. The outer shell 120 is formed creating a transverse p/n junction. (FIG. 1)
3. The first mirror 102 is applied by deposition or wafer bonding to the bulk n-type semiconductor region 104. (FIG. 1)

It has been discovered that the present invention thus has numerous beneficial aspects.

An aspect is that the present invention provides a stack of multiple gain regions, spaced by ½ wavelength from each other, allowing resonant periodic gain to provide higher device gain. This would allow significant improvement over vertical cavity surface emitting lasers with low gain active regions. It has been discovered that the disclosed structure provides improved performance of vertical cavity surface emitting lasers. The performance improvement provides additional application or system opportunities as well as improved manufacturing margins and yields.

These and other valuable aspects of the present invention consequently further the state of the technology.

Thus, it has been discovered that the VCSEL system method and apparatus of the present invention furnish important and heretofore unknown and unavailable solutions, capabilities, and functional aspects for display systems and optical data storage. The resulting processes and configurations are straightforward, cost-effective, uncomplicated, highly versatile and effective, can be implemented by adapting known technologies, and are thus readily suited for efficiently and economically manufacturing vertical cavity surface emitting lasers.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the spirit of the included claims. All matters hither-to-fore set forth herein or shown in the accompanying drawings are to be interpreted in an illustrative and non-limiting sense.

The invention claimed is:

1. A VCSEL system comprising:
   a first mirror;
   an n-type vertical cavity above the first mirror, the n-type vertical cavity including integrated multiple gain regions;
   a transverse p/n junction formed laterally to the multiple gain regions, wherein a forward bias on the transverse p/n junction will cause the recombination of electrons and holes within the integrated multiple gain regions, for photon emission; and a p-type GaN outer shell formed around the multiple gain regions;

Wherein the p-type GaN outer shell formed and the n-type multiple gain regions form the transverse p/n junction.

2. The system as claimed in claim 1 further comprising a second mirror on the n-type vertical cavity positioned above the integrated multiple gain regions and the first mirror.

3. The system as claimed in claim 1 wherein the integrated multiple gain regions comprise the integrated multiple gain regions spaced multiples of ½ wavelength between each other.

4. The system as claimed in claim 1 further comprising quantum well layers with lower bandgap energies than an n-type semiconductor spacer formed in the vertical cavity between the integrated multiple gain regions.

5. The system as claimed in claim 1 further comprising a dielectric ELOG mask over the bulk n-type semiconductor region.

6. The system as claimed in claim 1 further comprising a p-type contact and a n-type contact for the application of the forward bias the transverse p/n junctions.

7. The system as claimed in claim 1 further comprising a substrate of sapphire for epitaxial growth of the bulk n-type semiconductor region thereon.

8. The system as claimed in claim 1 further comprising a bulk n-type semiconductor region around the first mirror.

9. The system as claimed in claim 1 further comprising a sapphire substrate wafer bonded to the first mirror.

10. The system as claimed in claim 1 further comprising a sapphire substrate for epitaxial growth of the bulk n-type semiconductor region prior to wafer bonding or depositing the first mirror.

* * * * *